United States Patent [19]

Dijkmans

[11] 3,811,097

[45] May 14, 1974

[54] A VARIABLE FREQUENCY ASTABLE MULTIVIBRATOR

[75] Inventor: Eise Carel Dijkmans, Emmasingel, Netherlands

[73] Assignee: U.S. Philips Corporation, New York, N.Y.

[22] Filed: Nov. 10, 1972

[21] Appl. No.: 305,534

[30] Foreign Application Priority Data

Nov. 17, 1971 Netherlands ....................... 7115805

[52] U.S. Cl. .................... 332/14, 331/109, 331/113, 307/272

[51] Int. Cl. ............................................ H03k 7/00

[58] Field of Search ........... 307/285, 273, 318, 272; 332/14, 9; 331/109, 113

[56] References Cited

UNITED STATES PATENTS

| | | | |
|---|---|---|---|
| 3,061,799 | 10/1962 | Biard | 332/14 |
| 3,077,567 | 2/1963 | Gray | 332/14 X |
| 3,167,726 | 1/1965 | Foerster | 332/14 X |
| 3,204,200 | 8/1965 | White | 332/14 |
| 3,382,457 | 5/1968 | Conway | 332/14 X |
| 3,445,788 | 5/1969 | Camenzind | 332/14 X |

*Primary Examiner*—Andrew J. James
*Attorney, Agent, or Firm*—Frank R. Trifari

[57] ABSTRACT

Emitter-coupled astable multivibrator in which the charging and discharging currents for the coupling capacitor are supplied by a current source circuit the two outputs of which are connected each to a terminal of the capacitor. This current source circuit comprises a differential stage and a four-quadrant multiplier.

5 Claims, 2 Drawing Figures

A VARIABLE FREQUENCY ASTABLE MULTIVIBRATOR

Figure 1:
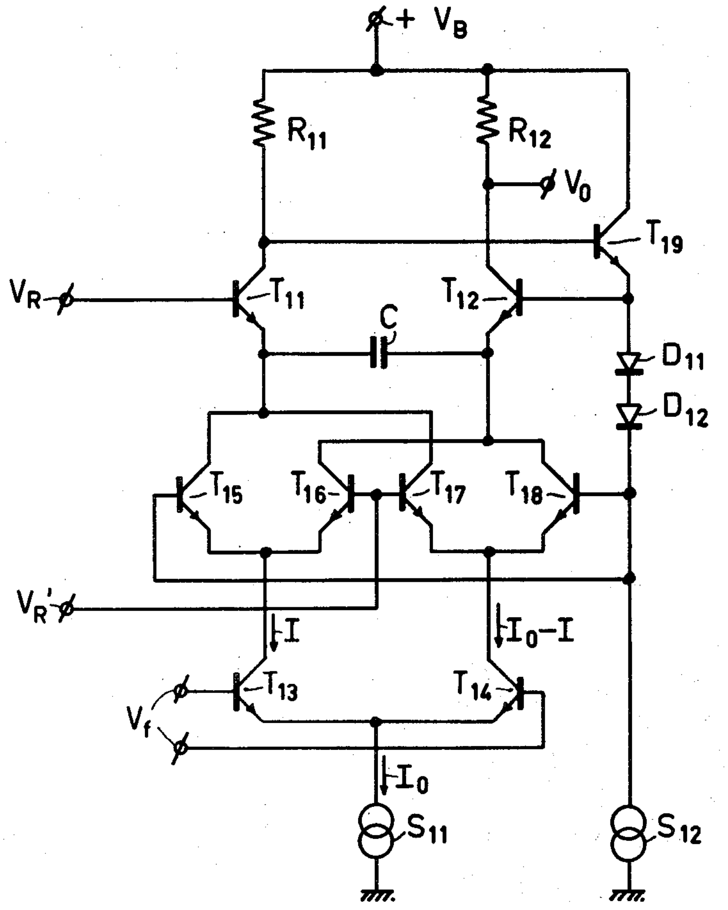

The invention relates to a multivibrator circuit having a variable oscillation frequency and including a first and a second transistor which each have a control electrode, a supply electrode and an output electrode, the supply electrodes of the two transistors being intercoupled via a capacitive element, whilst the control electrode of at least one of the transistors is coupled to the output electrode of the other transistor, a first output current from a current source circuit being supplied to the junction point of the supply electrode of the first transistor and the capacitive element and a second output current from this current source circuit being supplied to the junction point of the supply electrode of the second transistor and the capacitive element, the magnitudes of these currents being dependent upon a control signal applied to this current source circuit.

If the transistors used are bipolar transistors the invention relates to what is generally termed an emitter-coupled multivibrator. The oscillation frequency of such a multivibrator is determined by the time required to charge the capacitive element to a first threshold value and by the time required to discharge this capacitive element to a second threshold value. Thus this oscillation frequency is determined by the value of the capacitive element, the values of the charging and discharging currents and the voltage swing of the capacitive element, i.e., the voltage difference between the said two threshold values. To enable the oscillation frequency to be varied one these quantities can be made variable.

A multivibrator circuit of the type described at the beginning of this specification is described, for example, in U.S. Pat. No. 3,061,799. In the multivibrator circuits described in this patent the oscillation frequency is varied by means of variable charging and discharging currents which may simultaneously be controlled. However, in this known multivibrator circuit, in order to obtain a variable oscillation frequency further provisions are necessary to ensure that the voltage swing of the capacitive element is maintained constant irrespective of the values of the charging and discharging currents, for without these additional provisions this voltage swing would vary in proportion to these currents, so that a current variation would have no effect at all on the oscillation frequency.

Further more additional provisions are necessary in this known multivibrator circuit to obtain a frequently desired constant pulse height of the squarewave output signal. For this purpose the output signal is to be limited by means of a limiter circuit, causing the pulse height to be determined by the parameters of this limiter circuit irrespective of the frequency.

As a result of the necessity of the said additional provisions the possible frequency swing, i.e., the difference between the maximum and minimum frequencies of oscillation, is limited. Furthermore, in this known multivibrator circuit and current source circuit has to satisfy exacting requirements, especially if a constant pulse duty factor, i.e., a constant ratio between the effective pulse duration and the spacing of the output signal is desired.

It is an object of the present invention to provide a multivibrator circuit of the type described at the beginning of this specification in which the said additional provisions may be displaced with, so that the restrictions and disadvantages due to these additional provisions are avoided, and which also has a highly satisfactory stability and sensitivity without the various elements of the circuit having to satisfy extremely high requirements in respect of accuracy.

The invention is characterized in that the current-source circuit includes a differential stage having a sum terminal, two control terminals and two output terminals, whilst to the sum terminal a constant current is supplied which is divided between the two output terminals in accordance with the control signal for the current source circuit which is applied as a differential signal to the control terminals of the differential stage, and in that it further includes a four-quadrant multiplier circuit having two input current terminals which are connected to the output terminals of the differential stage, two output terminals which supply the output currents of the current source circuit, and two input control terminals to at least one of which a switching signal is applied which depends upon the state of the multivibrator, so that the output currents of the current source circuit alternately are equal to the respective currents at the input current terminals of the multiplier circuit.

The provisions according to the invention first ensure that both the voltage swing of the capacitive element and the pulse height of the output signal are constant, i.e., independent of the frequency of oscillation, without special provisions, such as a limiter circuit, being required. Further it is ensured that the pulse duty factor of the output signal automatically is equal to ½, irrespective of the frequency of oscillation and without the current source circuit having to satisfy special requirements. Furthermore the circuit has the advantage that the control signal may be applied to the current source circuit as a differential signal, which provides large advantages in respect of supply voltage influence and drift problems.

If the multivibrator circuit according to the invention is made entirely symmetrical by coupling the control electrodes of the first and the second transistor to the output electrode of the respective other transistor and by supplying mutually inverse switching signals to the two input control terminals of the multiplier circuit, a circuit is obtained the operation of which is largely independent of the supply voltage and hence of any variations of this supply voltage.

Figure 2:
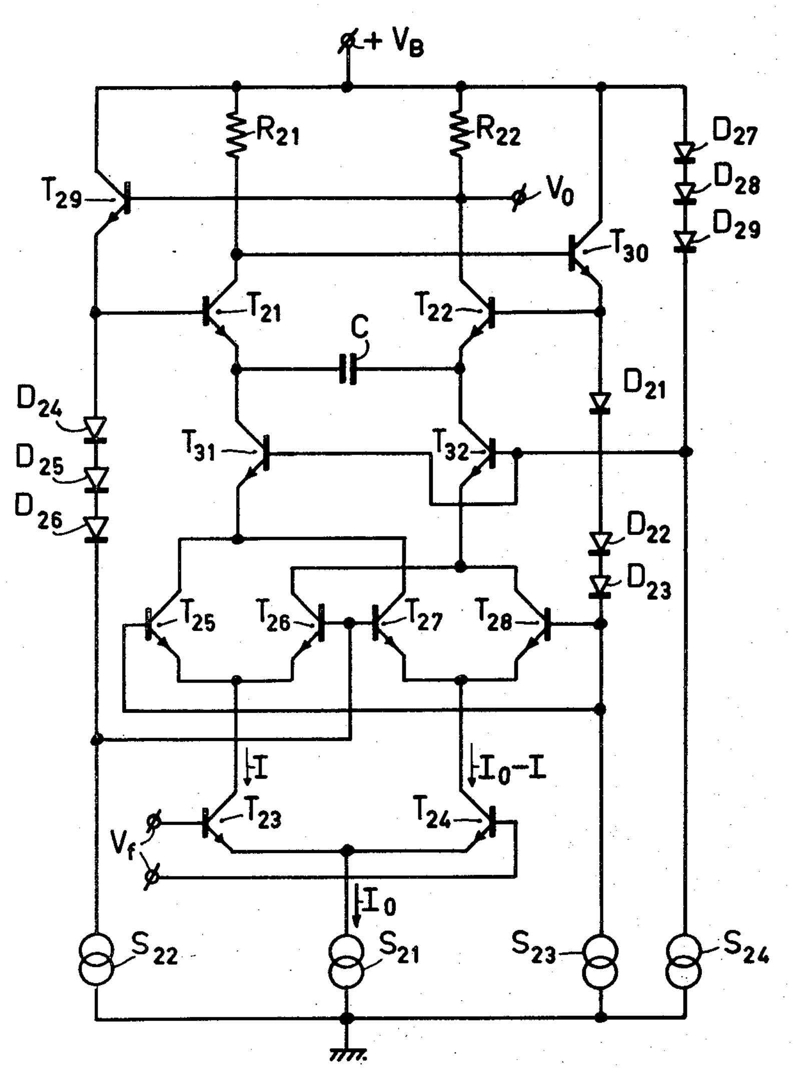

Embodiments of the invention will now be described, by way of example, with reference to the accompanying diagrammatic drawings, in which FIG. 1 is a schematic circuit diagram of the multivibrator circuit according to this invention, and FIG. 2 is a schematic circuit diagrams of another embodiment of the multivibrator circuit according to the invention.

FIG. 1 shows a first embodiment of a multivibrator circuit according to the invention. The circuit first includes an oscillator part which comprises transistors $T_{11}$ and $T_{12}$, the emitters of which are interconnected via a capacitor C, and collectors resistors $R_{11}$ and $R_{12}$. The base of the transistor $T_{12}$ is connected to the collector of the transistor $T_{11}$ via an emitter follower $T_{19}$, while the base of the transistor $T_{11}$ is connected to a reference voltage $V_R$. The emitter follower $T_{19}$ reduces the load imposed on the resistor $R_{11}$, but it is not essential for the operation of the circuit and may if desired be dispensed with.

The current source circuit includes a first differential stage comprising transistors $T_{13}$ and $T_{14}$ the emitters of which are connected to a current source $S_{11}$. The current source circuit further includes a second differential stage which comprises transistors $T_{15}$ and $T_{16}$ the emitters of which are connected to the collector of the transistor $T_{13}$, and a third differential stage comprising transistors $T_{17}$ and $T_{18}$ the emitters of which are connected to the collector of the transistor $T_{14}$. These second and third differential stages together form a configuration which corresponds to that of a four-quadrant multiplex in that the bases of the transistors $T_{15}$ and $T_{18}$ are interconnected, as are the bases of the transistors $T_{16}$ and $T_{17}$, the collectors of the transistors $T_{15}$ and $T_{17}$ and the collectors of the transistors $T_{16}$ and $T_{18}$. In this configuration the collectors of the transistors $T_{15}$ and $T_{17}$ form a first output of the current source circuit and are connected to the emitter of the transistor $T_{11}$, whilst the collectors of the transistors $T_{16}$ and $T_{18}$ form the second output of this current source circuit and are connected to the emitter of the transistor $T_{12}$. Furthermore the bases of the transistors $T_{15}$ and $T_{18}$ receive a switching signal which via a level-shifting circuit comprising diodes $D_{11}$ and $D_{12}$ is derived from the base of the transistor $T_{12}$. The bases of the transistors $T_{16}$ and $T_{17}$ are connected to a reference voltage $V_R'$. The current required for the diodes $D_{11}$ and $D_{12}$ and the transistor $T_{19}$ is supplied by a current source $S_{12}$.

In the operation of the multivibrator circuit the transistors $T_{11}$ and $T_{12}$ will again alternately be conducting. With a suitable choice of the reference voltage $V_R'$ the transistors $T_{16}$, $T_{17}$ and $T_{15}$, $T_{18}$ also will alternately conduct, because the bases of the transistors $T_{15}$ and $T_{18}$ are coupled to the base of the transistor $T_{12}$. This has far-reaching consequence for the operation of the multivibrator circuit, as will now be set out.

Assuming, for example, that at a certain instant the transistor $T_{11}$ is conducting and the transistor $T_{12}$ is non-conducting. The base voltage of the transistor $T_{12}$ then is comparatively low and hence so are the base voltages of the transistors $T_{15}$ and $T_{18}$. As a result, at a suitable value of the reference voltage $V_R'$ these transistors $T_{15}$ and $T_{18}$ will be non-conducting, whilst the transistors $T_{16}$ and $T_{17}$ are conducting. This means that the collector current of the transistor $T_{13}$, say I, is supplied via the transistor $T_{16}$ to the capacitor C, while the collector current of the transistor $T_{14}$, say $I_O - I$, where $I_O$ is equal to the current supplied by the current source $S_{11}$, is supplied to the transistor $T_{11}$ via the transistor $T_{17}$. Thus the current through the capacitor C is equal to the collector current I of the transistor $T_{13}$, while the overall current through the transistor $T_{11}$ is equal to $I_O$, i.e., the sum of the collector currents of the transistors $T_{13}$ and $T_{14}$.

When the capacitor C is discharged by the current I to a voltage such that the transistor $T_{12}$ becomes conducting and the transistor $T_{11}$ becomes non-conducting, the transistors $T_{16}$ and $T_{17}$ also becomes non-conducting and the transistors $T_{15}$ and $T_{18}$ become conducting. The charging current for the capacitor C then is again supplied by the collector of the transistor $T_{13}$, but now via the transistor $T_{15}$, while the collector current of the transistor $T_{14}$ is supplied via the transistor $T_{18}$ to the transistor $T_{12}$.

This shows that both the charging current and the discharging current of the capacitor are supplied by the collector of the transistor $T_{13}$ are hence each are equal to I. It is further shown that the frequency of oscillation can be varied by variations of this current I due to the application of a differential or control signal $V_f$ to the bases of the transistors $T_{13}$ and $T_{14}$ without the need for additional provisions, for a change of the differential voltage $V_f$ changes the collector current I of the transistor $T_{13}$ and hence the charging and discharging currents of the capacitor. In contradistinction to the known circuit, however, the voltage swing of the capacitor automatically is constant, because the sum of the currents supplied by the current supply circuit always is constant, i.e., equal to $I_O$, and this voltage swing is determined by the sum of these currents.

Thus, the first advantage of the circuit according to the invention as compared with the known circuit is that no further provisions are required for maintaining constant the voltage swing of the capacitor. Consequently, in the multivibrator according to the invention the restriction with respect to the frequency swing also does not occur. The maximum frequency is twice the rest frequency ($I = I_0/2$) and is limited only by the cut-off frequency of the transistors, while the minimum frequency is limited only by the leakage currents and the amplification factor of the transistors.

Furthermore the pulse height of the output signals across the two resistors $R_{11}$ and $R_{12}$ is independent of the frequency, because this pulse height is determined by the constant current $I_0$ through these resistors. The pulse duty factor of the output signal automatically is equal to an ½, because the charging current and the discharging current of the capacitor automatically are equal to one another, since they are both supplied by the transistor $T_{13}$.

A final advantage is that the control signal $V_f$ can be supplied as a differential signal, so that supply voltage variations exert less influence and drift phenomena are considerably reduced.

FIG. 2 shows a second embodiment. The oscillator part again includes two transistors $T_{21}$ and $T_{22}$ the emitters of which are coupled via a capacitor C and which have collector resistors $R_{21}$ and $R_{22}$ respectively. In this embodiment, however, the base of each of the transistors $T_{21}$ and $T_{22}$ is coupled to the collector of the respective other transistor via transistors $T_{29}$ and $T_{30}$ respectively which are connected as emitter followers. The current source circuit is substantially equal to that of FIG. 2 and comprises transistors $T_{23}$ to $T_{28}$, a difference consisting in that the bases of the transistors $T_{26}$ and $T_{27}$ are not connected to a reference voltage but via a level shifting circuit $D_{24}$, $D_{25}$, $D_{26}$ receive a switching signal from the base of the transistor $T_{21}$. Furthermore the outputs of this current source circuit are connected to the terminals of the capacitor C not directly, but via the emitter collector paths of transistors $T_{31}$ and $T_{32}$. The bases of these transistors $T_{31}$ and $T_{32}$ are connected to a fixed reference voltage which is derived from the supply voltage $+V_B$ by means of diodes $D_{27}$, $D_{28}$ and $D_{29}$. The quiescent current required for the emitter follower $T_{29}$ and for the level shifting circuit $D_{24}$ to $D_{26}$ is supplied by a current source $S_{22}$, the current required for the emitter follower $T_{30}$ and the level shifting circuit $D_{21}$ to $D_{23}$ by a current source $S_{23}$, and the current required for the level shifting circuit $D_{27}$ to $D_{29}$ by a current source $S_{24}$.

The operation of this completely symmetrical circuit otherwise is entirely identical to that of the circuit shown in FIG. 1. The use of the emitter followers $T_{29}$ and $T_{30}$ ensures that only very small loads are imposed on the collector resistors. The transistors $T_{31}$ and $T_{32}$ produce an additional separation between the oscillator part and the current source circuit.

In comparison to the embodiment shown in FIG. 2 the embodiment shown in FIG. 2 has the advantage that the dependence upon the supply voltage is reduced. In the embodiment shown in FIG. 1 the voltage swing of the capacitor still depends upon the supply voltage, because the reference voltage $V_R$ at the base of the transistor $T_{11}$ in general will be dependent upon this supply voltage. In the embodiment shown in FIG. 2 the frequency of oscillation is entirely independent of the supply voltage and is determined only by the value of the capacitor C, the values of the resistors $R_{21}$ and $R_{22}$ and the control signal $V_f$.

The temperature dependence of the circuit may largely be compensated by using current sources $S_{22}$ to $S_{24}$ having positive temperature coefficients. Further it will be apparent that the circuits described may be modified according to the field of application without departing from the spirit and the scope of the invention. In some uses a separate drive of the difference stage $T_{23}$, $T_{24}$ will be required to obtain a satisfactory linear relationship between the frequency and the control signal. For this purpose, for example, the control signal may in known manner be supplied as a difference current to two diodes connected in the forward direction or to transistors connected as diodes which on the one hand are connected to a point of fixed potential and on the other hand to the bases of the transistors $T_{23}$ and $T_{24}$.

If, for example, when the circuit is used in a phase-locked loop, much importance is attached to high sensitivity, the control signal may obviously be directly applied as a differential voltage to the bases of the transistors $T_{23}$ and $T_{24}$. Also, the differential stage $T_{23}$, $T_{24}$ and the current source $S_{21}$ may be replaced by two intercoupled current inverter circuits as described, for example, in "International Solid State Circuits Conference," 1971, page 185, FIG. 3. In such a configuration a common-mode current supplied to the input is amplified by a factor which depends upon the geometry of the transistors used, for example unity, whilst a differential current supplied to the input is amplified by a factor equal to the current amplification factor of the transistors, which consequently may be considerable.

Further it will be appreciated that the level shifting circuits may be designed differently, for example may comprise Zener diodes. Also, the output signal $V_O$ may be taken from other points, for example from the emitter of one of the emitter followers $T_{29}$ and $T_{30}$. When the voltage across the capacitor C is used as the output voltage the circuit arrangement may act as a triangular voltage generator.

Finally, although in the embodiments shown the multivibrator circuit includes bipolar transistors, it may obviously, in some cases even advantageously, include unipolar transistors, such as field effect transistors, the gates of which may or may not be isolated.

What is claimed is:

1. A variable frequency astable multivibrator comprising two amplifying elements each having a control electrode, an output electrode and a supply electrode, a coupling network for coupling the control electrode of one amplifying element to the output electrode of the other amplifying element, said network including a capacitive element connected between the supply electrodes, a first circuit including a differential stage having a common input terminal connected in series with a current source, two first output terminals and means for controlling the amount of current flowing therethrough, and a second circuit including two bistable gating stages having input terminals connected to said first output terminals, second output terminals connected to the supply electrodes of said amplifying elements, respectively, and control means coupled to at least one amplifying element to alternate the states of said bistable gating stages in accordance with the alternation of stages of said amplifying elements, thereby providing substantially equal charging and, respectively, discharging currents paths for said capacitive element.

2. An astable multivibrator as claimed in claim 1, wherein said amplifying elements are switching transistors each having a base corresponding to said control electrode, a collector corresponding to said output electrode and an emitter corresponding to said supply electrode.

3. An astable multivibrator as claimed in claim 2, wherein said first circuit includes a source of a variable control signal, a pair of transistors having emitters connected to said common input terminals, collectors connected to said first output terminals, respectively, and bases connected to said source of the variable control signals, said second differentiating circuit including two pairs of transistors, each pair having emitters connected to an assigned output terminal of said first circuit, the base of each transistor in one pair being connected to the base of a corresponding transistor in the other pair, the collector of one transistor in each pair being coupled to the emitter of one switching transistor and the collector of the other transistor in each pair being coupled to the emitter of the other switching transistor.

4. An astable multivibrator as claimed in claim 3, further comprising semiconductor junction means for coupling the base of one switching transistor to a connected pair of bases in said second circuit.

5. An astable multivibrator as claimed in claim 3, further comprising a pair of separating transistors each being coupled between the emitter of one switching transistor and the connected collectors in said second circuit.

* * * * *